(12) United States Patent
Urios et al.

(10) Patent No.: US 12,359,293 B2
(45) Date of Patent: Jul. 15, 2025

(54) COATED STEEL SUBSTRATE, A METHOD FOR THE MANUFACTURE OF A COATED STEEL SUBSTRATE, A METHOD FOR MANUFACTURE OF A STEEL PRODUCT AND A STEEL PRODUCT

(71) Applicants: ArcelorMittal, Luxembourg (LU); Luxembourg Institute of Science and Technology (LIST), Luxembourg (LU)

(72) Inventors: Thomas Urios, Hettange-Grande (FR); Patrick Choquet, Longeville les Metz (FR); Sergey Ershov, Dalheim (LU)

(73) Assignees: ArcelorMittal, Luxembourg (LU); Luxembourg Institute of Science and Technology (LIST), Luxembourg (LU)

( * ) Notice: Subject to any disclaimer, the term of this patent is extended or adjusted under 35 U.S.C. 154(b) by 320 days.

(21) Appl. No.: 17/439,506

(22) PCT Filed: Mar. 20, 2020

(86) PCT No.: PCT/IB2020/052577
§ 371 (c)(1),
(2) Date: Sep. 15, 2021

(87) PCT Pub. No.: WO2020/188529
PCT Pub. Date: Sep. 24, 2020

(65) Prior Publication Data
US 2022/0154326 A1 May 19, 2022

(30) Foreign Application Priority Data

Mar. 20, 2019 (WO) .................. PCT/IB2019/052260

(51) Int. Cl.
*C23C 2/00* (2006.01)
*C22C 38/02* (2006.01)
(Continued)

(52) U.S. Cl.
CPC ................ *C23C 2/00* (2013.01); *C22C 38/02* (2013.01); *C22C 38/04* (2013.01); *C22C 38/06* (2013.01);
(Continued)

(58) Field of Classification Search
None
See application file for complete search history.

(56) References Cited

U.S. PATENT DOCUMENTS 4,963,440 A * 10/1990 Shimogori .............. C23C 14/16
428/641
7,132,130 B1 11/2006 Kloss et al.
2014/0044986 A1 * 2/2014 Pillhoefer ............... C23C 10/60
427/404

FOREIGN PATENT DOCUMENTS

CN 105862003 A 8/2016
EP 0584364 A1 3/1994
(Continued)

OTHER PUBLICATIONS

See Search Report of PCT/IB2020/052577 dated Dec. 5, 2020.

*Primary Examiner* — Seth Dumbris
(74) *Attorney, Agent, or Firm* — Davidson Kappel LLC

(57) ABSTRACT

A coated steel substrate coated with a first coating including above 40 wt. % of chromium and optionally one or several elements chosen from yttrium, silicon, calcium, titanium, zirconium, vanadium, niobium and nickel in an amount below 10 wt. % for each element, the balance being chromium and a second coating including from 2 to 30 wt. % of Aluminum, from 10 to 40 wt. % of chromium and optionally one or several elements chosen from yttrium, silicon, calcium, titanium, zirconium, vanadium, niobium and nickel in an amount below 10 wt. % for each element, the balance being iron, the steel substrate including Cr≤2.0% by weight; a method for the manufacture of this coated steel substrate;

(Continued)

a method for the manufacture of a coated hot steel product;
a coated hot steel product and the use of a hot steel product.

24 Claims, 2 Drawing Sheets

(51) Int. Cl.
    *C22C 38/04*          (2006.01)
    *C22C 38/06*          (2006.01)
    *C22C 38/18*          (2006.01)
    *C23C 14/16*          (2006.01)
    *C23C 28/02*          (2006.01)
    *C23C 14/35*          (2006.01)

(52) U.S. Cl.
    CPC ............ *C22C 38/18* (2013.01); *C23C 28/021* (2013.01); *C23C 14/16* (2013.01); *C23C 14/35* (2013.01)

(56) References Cited

FOREIGN PATENT DOCUMENTS

| | | |
|---|---|---|
| JP | H02236272 | 9/1990 |
| JP | H0413862 | 1/1992 |
| JP | H0413862 A | 1/1992 |
| JP | H05302180 A | 11/1993 |
| JP | H10251869 A | 9/1998 |
| JP | 2003535976 A | 12/2003 |
| WO | WO0194664 A2 | 12/2001 |

\* cited by examiner

COATED STEEL SUBSTRATE, A METHOD FOR THE MANUFACTURE OF A COATED STEEL SUBSTRATE, A METHOD FOR MANUFACTURE OF A STEEL PRODUCT AND A STEEL PRODUCT

BACKGROUND OF THE INVENTION

The present invention relates to a coated steel substrate, a method for the manufacture of this coated steel substrate, a steel product and a method for the manufacture of this steel product. The invention is particularly well suited for the industry, civil engineering and construction fields.

In industry, civil engineering and construction fields, steel products are often used as metallic parts, in particular for marine metallic structures. For example, the metallic parts can be steel pilings, bearing piles, plates and beams used in the construction of combined walls, moles, parts of offshore wind powers or offshore structures. The main problem of these steel products is their resistance to corrosion. Indeed, the steel products are used in corrosive areas, i.e. in sea area. Due to these corrosive areas, the lifetime of such steel products can be divided by 5 when compared to the use of such steel products on earth. Thus, there is a need to provide metallic substrates having a higher resistance to corrosion in order to improve their lifetime especially in corrosive atmospheres.

SUMMARY OF THE INVENTION

Some protections can be used to protect these steel products. For example, it is known to produce these steel products with a sacrificial thickness, the lifetime depending on the thickness of the steel product. However, even if the sacrificial thicknesses improve the lifetime of these steel products, they do not really improve the corrosion resistance. It is also known to deposit paints or metallic coatings such as a zinc coating by hot-dip galvanizing. However, these deposition processes are very expensive and difficult to implement at industrial scale especially for long and heavy products.

Indeed, for example for the hot-dip galvanizing process, usually, a coil is firstly annealed and then hot-dipped in a zinc bath in the hot-dip galvanizing line. With the actual lines, it is difficult to cover long products such as beams or pilings.

Indeed, for example, the steel pilings are produced by hot-rolling at about 1250° C. The semi-finished products called "beam blank" pass through a walking beam furnace. Then, the scale formed during the reheating is removed from the beam blank. The blanks pass through rolling mills. After, the length of the steel piling is about 100 m. The steel piling is then cut in order to obtain a final length of around 20 m. The steel piling is finally cooled down and can be implementing in the soil in the sea. Due to the length and the shape of the steel piling, it cannot be hot-dipped in continuous hot-dip galvanizing lines.

Moreover, during the reheating step, semi-finished products oxidize and form scale. Scale is usually formed all around the semi-finished product's surface. Thus, a large amount of scale is removed during the descaling step resulting in a weight loss of the steel product.

The patent application JPH0413862 discloses a coated steel material coated with a Cr or Cr alloy-plating layer having a thickness ≥0.1 μm and an Al or Al alloy-plating layer having a thickness ≥0.1 μm. This coated steel material is heat-treated at a temperature above 500 and up to 650° C. for a short time in an in-line continuous heating furnace. Mutual diffusion is produced between Al and Cr plating layers by the heat treatment allowing a good heat and corrosion resistances. The formation of an Fe—Al intermetallic compound at the steel/coating interface is inhibited decreasing cracks during deformation.

However, the temperature range of the heating is very low. Theses coatings cannot be used for a steel substrate which must stay in a reheating furnace at a high temperature. Indeed, it is mentioned in this patent application that above 650° C., the diffusion between Cr and Al layers is problematic. The layers diffuse even to the steel sheet and Al will form a Fe—Al system intermetallic compound which will cause cracks during processing and cause a degradation of heat and corrosion resistance.

The patent application JPH02236272 discloses a coated steel material coated with Cr or an alloy of Cr including Ni or Co having a thickness 0.1 μm and further, an Al layer or an alloy layer of Al including Cr, Ti, Ni, Co, etc., such alloy layer having a thickness ≥0.1 μm. The steel product having two layers consisting of the Cr system and the Al system is heat-treated at 200 to 500° C. in a nonoxidative atmosphere. Mutual diffusion arises between Cr layer and Al layer by this heat treatment. The formation of an Fe—Al intermetallic compound at the steel/coating interface is inhibited. The generation of cracks in the vapor deposited layer of the Cr system at the time of working is prevented by the diffused layers and the corrosion based on cracks decreases. The steel product coated with the two layers has heat resistance generated by the Cr and good appearance generated by the Al.

However, the heat is performed in a non-oxidative atmosphere to prevent the oxidation of aluminum and chromium. A non-oxidative atmosphere is difficult to implement in a reheating furnace on line. Indeed, usually, the atmosphere of a reheating furnace comprises air. Moreover, the temperature range of the heating is very low. Theses coatings cannot be used for a steel substrate in a reheating furnace. Indeed, it is mentioned in this patent application that above 500° C., the diffusion will arise not only between Cr and Al layers, but also with iron from steel sheet. This leads to the formation of a Fe—Al system intermetallic compound which will causes cracks during processing and cause a degradation of heat and corrosion resistance.

It is an object of the invention to provide a coated steel substrate wherein the weight loss due to the oxidation of semi-products during the reheating step before the rolling is reduced. An alternate or additional object is to provide a steel product having an improved resistance to corrosion, and therefore a longer life time especially in corrosive environment.

The present invention provides a coated steel substrate coated with a first coating comprising above 40 wt. % of chromium and optionally one or several elements chosen from yttrium, silicon, calcium, titanium, zirconium, vanadium, niobium and nickel in an amount below 10 wt. % for each element, the balance being chromium and a second coating comprising from 2 to 30 wt. % of Aluminum, from 10 to 40 wt. % of chromium and optionally one or several elements chosen from yttrium, silicon, calcium, titanium, zirconium, vanadium, niobium and nickel in an amount below 10 wt. % for each element the balance being iron, said steel substrate comprising Cr≤2.0% by weight.

BRIEF DESCRIPTION OF THE DRAWINGS

To illustrate the invention, various embodiments and trials of non-limiting examples will be described, particularly with reference to the following Figure.

DETAILED DESCRIPTION

Other characteristics and advantages of the invention will become apparent from the following detailed description of the invention.

The following terms will be defined:

"wt. %" means the percentage by weight.

Figure 1:
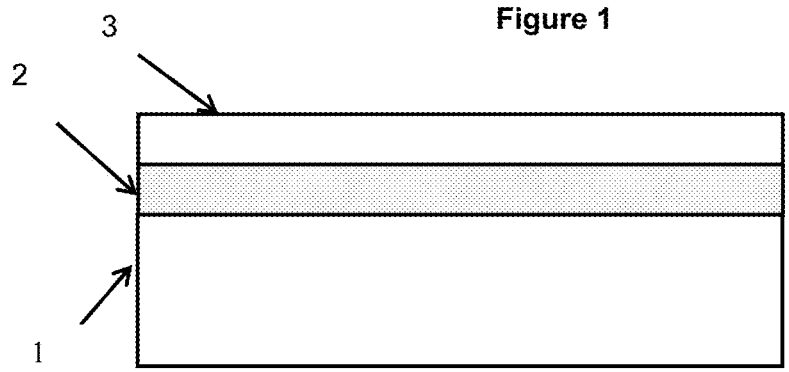
FIG. 1 illustrates an example of coated steel substrate according to the present invention.

As illustrated in FIG. 1, the invention relates to a coated steel substrate 1 coated with a first coating 2 comprising above 40 wt. % of chromium and a second coating 3 comprising from 2 to 30 wt. % of Aluminum, from 10 to 40 wt % of chromium, the balance being iron, said steel substrate comprising Cr≤2.0% by weight.

Without willing to be bound by any theory, it seems that when the steel substrate is coated with a first coating consisting of chromium and a second coating comprising from 2 to 30 wt. % of Aluminum, from 10 to 40 wt % of chromium, the balance being iron, the steel substrate is well protected during the reheating since the first and the second coatings act together to significantly limit the oxidation reducing and therefore the scale formation during the reheating of the coated steel substrate. Moreover, they also allow chromium to diffuse in steel increasing the corrosion resistance of steel and therefore, the lifetime of steel substrate.

Preferably, the steel substrate has the following chemical composition in weight percent:

C≤2.0%,
Al≤2.0%,
and on a purely optional basis, one or more elements such as
Mn≤2.5%,
Si≤2.5%,
P<0.1%,
Nb≤0.5%,
B≤0.005%,
S≤0.02%,
N≤0.1%,
Mo≤0.50%,
Ni≤1.0%,
Ti≤0.5%, the reminder of the composition making up of iron and inevitable impurities resulting from the elaboration.

Indeed, without willing to be bound by any theory, it is believed that the amounts of Al and Cr in the steel are preferably below 2.0 wt. % because if the amounts of Al and Cr in the steel is above 2.0 wt %, there is a risk to reduce the diffusion of Cr in steel.

Preferably, the steel substrate comprises an aluminum amount being equal or below 1.0 wt % and more preferably, being equal or below 0.5 wt %. Indeed, without willing to be bound by any theory, it is believed that an enrichment of aluminum in the steel substrate can be provided mainly with the second coating. It is believed that the enrichment of aluminum allows for an improvement of the oxidation resistance.

Preferably, the steel substrate comprises a chromium amount being equal or below 1.0 wt % and more preferably, being equal or below 0.5 wt %. Indeed, without willing by any theory, it is believed that an enrichment of chromium in the steel substrate is provided mainly with the first coating.

It is believed that the enrichment of chromium allows for an improvement of the corrosion resistance.

Advantageously, the first coating consists of chromium meaning that the amount of chromium is 99 wt. %.

Preferably, the first coating has a thickness between 0.5 µm and 1000 µm, more preferably between 0.5 µm and 500 µm, advantageously between 1.0 µm and 200 µm. Indeed, without willing to be bound by any theory, it is believed that if the thickness of the first coating is above 1000 µm, there is a risk that the diffusion of chromium into steel is too important leading to a modification of mechanical properties of steel.

Figure 2:
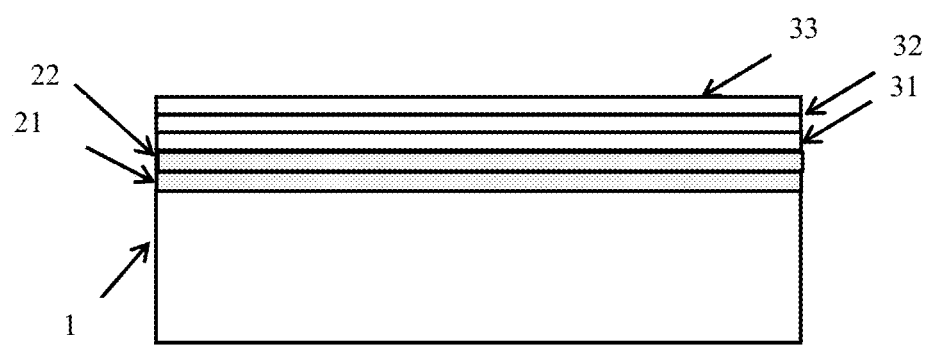
FIG. 2 illustrates another example of coated steel substrate according to the present invention.

As illustrated in FIG. 2, advantageously, the first coating comprises at least two layers 21, 22 comprising chromium. In this case, many layers of chromium are deposited forming one first coating consisting of chromium.

Preferably, the second coating comprises at least two layers comprising from 2 to 30 wt. % of Aluminum, from 10 to 40 wt % of chromium the balance being iron. FIG. 2 represents an example wherein the second layer comprises three layers 31, 32 and 33 comprising from 2 to 30 wt. % of Aluminum, from 10 to 40 wt % of chromium the balance being iron.

When at least two layers of the first coating and/or second coating are deposited, it is believed that they form of a tortuous path. Thus, it seems that the oxygen diffusion through the coating is very restricted allowing an important reduction of the scale formation and a significant weight gain of the steel substrate.

Preferably, the second coating comprises from 15 to 30 wt. % of chromium.

Advantageously, the second coating comprises from 8 to 20 wt. % of aluminum.

a. Preferably, the second coating has a thickness between 0.5 µm and 1000 µm, more preferably between 0.5 µm and 500 µm, advantageously between 1.0 µm and 200 µm. Indeed, without willing to be bound by any theory, it is believed that when the thickness of the second coating is above 1000 µm, there is a risk to decrease to barrier effect of the coating and therefore to increase the oxygen absorption during the reheating furnace.

b. Preferably, the thickness of the first coating is less than the thickness of the second coating.

Preferably, the first and/or second coating further comprises at least one additional element chosen from among: yttrium, silicon, calcium, titanium, zirconium, vanadium, niobium and nickel. It seems that these elements further improve the adhesion of the oxides formed on the coating surface during the reheating. Preferably, the amount of at least one element is below 10 wt %, more preferably 8 wt. %, advantageously 4 wt. % and for example below 2 wt. % or below 1 wt. %. Advantageously, Thus, the amount of at least one element is above 0.1 wt. %. It is believed that the steel is well protected against oxygen and therefore oxidation.

Advantageously, the substrate is a semi-finished product such as a beam blank, slab, billet or bloom.

The present invention also provides a method for the manufacture of a coated steel substrate according to the present invention comprising the following steps:

A. The provision of a steel substrate according to the present invention,

B. The deposition of the first coating according to the present invention,

C. The deposition of the second coating according to the present invention,

D. Optionally, a preparation step on the steel surface performed before step B) and/or C).

Preferably, the deposition of the first and second coating independently from each other is performed by Physical Vapor Deposition (PVD), cold spray, chemical vapor deposition (CVD), hot-dip coating or electrodeposition.

Optionally, a preparation step is performed in step D). It is believed that this step provides a discontinuous microstructure on the steel substrate and/or on the first coating delaying the oxygen diffusion into the steel substrate.

Preferably, in step D), the preparation step is performed using physical bombardment of the steel surface including ions, electrons, metallic cluster, light, an energetic plasma or using chemical treatment such as pickling. It can also be done by shot blasting, like grit blasting or sand blasting.

Preferably, in steps B) and/or C), when the first and/or the second coating(s) comprise(s) at least two layers, steps B) and/or C) are performed for each layer.

Preferably, when the first and/or the second coating(s) comprise(s) at least two layers, step D) is performed before the deposition of each layer.

The present invention further provides a method for manufacture of a steel product comprising the following successive steps:

I. The provision of the coated steel substrate according to the present invention,
II. The reheating of the coated steel substrate in a reheating furnace having an atmosphere containing oxygen with a temperature between 850 and 1400° C.,
III. Optionally, the descaling of the reheated coated steel obtained in step II) and
IV. Optionally, the hot-forming of the descaled steel product.

Figure 3:
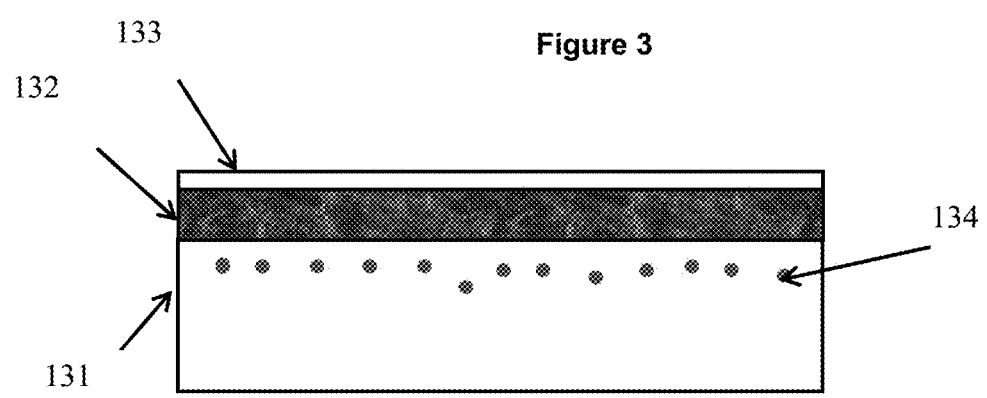
FIG. 3 illustrates an example of a steel product after reheating according to the present invention.

The reheating step II) is performed at a temperature between 850 and 1400° C., preferably between 1200 and 1400° C. As illustrated in FIG. 3, it is believed that after the heating, the steel substrate 131 is coated with an alloyed coating layer 132 comprising aluminum, chromium, and optionally one or several elements chosen from yttrium, silicon, calcium, titanium, zirconium, vanadium, niobium and nickel, the balance being iron directly topped by an oxide layer 133 comprising at least aluminum oxide, the alloyed coating layer and steel being alloyed through diffusion. This oxide layer acts like a barrier to oxygen decreasing the formation of scale. The oxide layer can further comprise chromium and/or iron oxide. Advantageously, the oxide layer comprises at least one oxide selected from: $Al_2O_3$, $Cr_2O_3$, $FeAl_2O_4$ and $FeCr_2O_4$. Moreover, it seems that this oxide layer allows chromium 134 to diffuse into the steel substrate increasing thus the corrosion resistance of the steel.

Optionally, during step III), the descaling is performed using water under pressure or the descaling is performed mechanically. Preferably, the water pressure is between 100 and 150 bars. It is believed that when the descaling is performed, the alloyed coating and the oxide layer are removed.

Preferably, in step IV), the hot forming is a hot-rolling, hot extrusion, hot stamping or hot bending.

Preferably, in step II), the atmosphere is an air atmosphere.

With the method according to the present invention, a steel product is obtained, said steel product comprising a decreasing chromium gradient starting from the steel product surface. Said steel product is coated with an alloyed coating layer comprising aluminum, chromium, and optionally one or several elements chosen from yttrium, silicon, calcium, titanium, zirconium, vanadium, niobium and nickel, the balance being iron directly topped by an oxide layer comprising at least aluminum oxide, the alloyed coating layer and steel being alloyed through diffusion.

More precisely, said decreasing chromium gradient can be described as follows:
a first region starting from the steel product surface comprising 10 to 40 wt. % of chromium, preferably extending from the steel product surface down to 30 to 60 µm and
a second region starting from the first region comprising less than 10 wt % of chromium, preferably extending from the first region down to 20 to 50 µm into the steel.

Preferably, the steel product comprises below 15 wt. % of chromium in the first region extending from the steel surface.

Preferably, the steel product is hot formed. For example, the steel product is hot rolled, hot extruded, hot stamped or hot bended Preferably, the steel product is chosen from: a piling, a wire, a rod, a plate, a tube, a rail, a corner, profile and a beam.

Preferably, the steel product is chosen from: a piling, a wire, a plate, a tube and a beam.

Finally, the present invention provides the use of a steel product according to the present invention, for the manufacture of offshore structure, offshore wind power, marine current power, hull of a boat, coastal and port infrastructure, quay wall, underground structure, rail and anchorage.

EXAMPLES

For all samples, the steel substrate has the following composition in weight percent (wt. %):

| C | Cr | Al | Si | Mn | S | P |
|---|---|---|---|---|---|---|
| 0.16 | 0.02 | 0.03 | 0.18 | 1.18 | 0.004 | 0.01 |

All samples were firstly casted in the form of beam blanks.

For Trial 2, steel substrate was coated with one layer of FeAl(12 wt. %)Cr(24 wt. %) by magnetron sputtering.

For Trials 3 to 9, 11 and 12, steel substrates were coated with a first coating consisting of chromium having a thickness of 2 µm and a second coating comprising Al(12 wt. %), Cr(24 wt. %) and optionally yttrium (0.3 wt. %), the balance being iron, having a thickness of 8 µm. For trial 13, the steel substrate was coated with a first coating consisting of chromium having a thickness of 2 µm and a second coating comprising Al (12)wt %, Cr (24 wt %) and Ni (3 wt %). For the second coating, 4 layers of 2 µm were deposited by magnetron sputtering. For some Trials, an ion bombardment step was performed before each deposition of layer.

Then, uncoated steels (Trials 1 and 10) and coated steels (Trials 2 to 9, 11 to 13) were reheated at a temperature being between 1000 and 1250° C. When a dynamic heating was performed, the heating temperature varied from 350 to 1250° C., the temperature being above 1000° C. during 1 h30. After the reheating, the oxidation of the Trial was determined by visual aspect: 3 means that the mill scale was present on the whole Trial; 2 means that mill scale is mainly present on the Trial; 1 means that mill scale is present on a little part of the Trial and 0 means that mill scale is not present at all on the Trial. When the mill scale was present on the whole Trial, the thickness of the mill scale was measured by Scanning Electron Microscopy (SEM). Results are shown in the following Table 1:

| Trials | Coating | Etching | Reheating step temperature (° C) | time | Mill scale (µm) | Visual aspect |
|---|---|---|---|---|---|---|
| 1 | — | no | 1150 | 2 h | 770-1160 | 3 |
| 2 | FeAlCr | no | 1150 | 2 h | 450 µm | 3 |
| 3* | 1$^{st}$ coating: Cr<br>2$^{nd}$ coating: FeAlCr | no | 1200 | 30 min | — | 0 |
| 4* | 1$^{st}$ coating: Cr<br>2$^{nd}$ coating: FeAlCr | yes | 1200 | 30 min | — | 0 |
| 5* | 1$^{st}$ coating: Cr<br>2$^{nd}$ coating: FeAlCr | no | 1250 | 30 min | — | 0 |
| 6* | 1$^{st}$ coating: Cr<br>2$^{nd}$ coating: FeAlCr | yes | 1250 | 30 min | — | 0 |
| 7* | 1$^{st}$ coating: Cr<br>2$^{nd}$ coating: FeAlCrY | yes | 1250 | 30 min | — | 0 |
| 8* | 1$^{st}$ coating: Cr<br>2$^{nd}$ coating: FeAlCr | yes | 1250 | 1 h | — | 2 |
| 9* | 1$^{st}$ coating: Cr<br>2$^{nd}$ coating: FeAlCrY | yes | 1250 | 1 h | — | 1 |
| 10 | — | no | 1250 | dynamic heating 2 h | 620-1150 | 3 |
| 11* | 1$^{st}$ coating: Cr<br>2$^{nd}$ coating: FeAlCr | yes | 1250 | dynamic heating 2h | — | 2 |
| 12* | 1$^{st}$ coating: Cr<br>2$^{nd}$ coating: FeAlCrY | yes | 1250 | dynamic heating 2 h | — | 0 |
| 13* | 1$^{st}$ coating: Cr<br>2$^{nd}$ coating : FeAlCrNi | yes | 1250 | Dynamic heating 2 h | — | 0 |

*according to the present invention

Trials according to the present invention showed excellent results compared to comparative Examples.

Table 2—Corrosion Tests

Corrosion tests were performed through an electrochemical study consisting of a punctual monitoring of the Eab free corrosion potential and the polarization resistance of the coupon's immersion in artificial seawater (ASTM D1141).

All electrochemical measurements were carried out with a potentiostat, an Ag/AgCl 3M reference electrode and a titanium counter electrode. The polarization resistance measurements Rp were carried out with a potential amplitude of ±15 mV around Eab and a scanning speed dE/dt of 0.2 mV/s. Temperature of water is ambient (non controlled, around 15° C. to 20° C.).

| Trials | Polarization Resistance (Ohm · cm$^2$) | Corrosion rate (µm · year$^{-1}$) | Corrosion resistance improvement (% vs Reference Trial 10) |
|---|---|---|---|
| 10 | 2000 | 115 | — |
| 12* | 3300 | 70 | 39 |
| 13* | 2700 | 85 | 26 |

*according to the present invention

These corrosion results show clearly the improvement of behavior of the trials according to the invention, compared to the reference trial 10.

What is claimed is:

1. A coated steel substrate comprising:
a steel substrate comprising Cr≤2.0% by weight;
a first coating including above 40 wt. % of chromium, 0%>=yttrium<10%, 0%>=silicon<10%, 0%>=calcium<10%, 0%>=titanium<10%, 0%>=zirconium<10%, 0%>=vanadium<10%, 0%>=niobium<10%, and 0% >=nickel<10%, a first coating balance being chromium; and
a second coating including from 2 to 30 wt. % of aluminum, from 10 to 40 wt. % of chromium, 0% >=yttrium<10%, 0%>=silicon<10%, 0%>=calcium<10%, 0%>=titanium<10%, 0%>=zirconium<10%, 0%>=vanadium<10%, 0%>=niobium<10%, and 0% >=nickel<10%, a second coating balance being iron.

2. The coated steel substrate as recited in claim 1 wherein the steel substrate has the further following chemical composition in weight percent:
C≤2.0%,
Al≤2.0%, and on an optional basis, one or more of the following elements:
Mn≤2.5%,
Si≤2.5%,
P<0.1%,
Nb≤0.5%,
B≤0.005%,
S≤0.02%,
N≤0.1%,
Mo≤0.50%,
Ni≤1.0%,
Ti≤0.5%, a remainder of the composition making up of iron and inevitable impurities resulting from processing.

3. The coated steel substrate as recited in claim 1 wherein the steel substrate has an aluminum amount equal or below 1.0 wt %.

4. The coated steel substrate as recited in claim 1 wherein the steel substrate has a chromium amount equal or below 1.0 wt %.

5. The coated steel substrate as recited in claim 1, wherein the first coating consists of chromium.

6. The coated steel substrate as recited in claim 1 wherein the first coating has a thickness between 0.5 µm and 1000 µm.

7. The coated steel substrate as recited in claim 1 wherein the first coating includes at least two layers, each of the at least two layers including chromium.

8. The coated steel substrate as recited in claim 1 wherein the second coating has from 15 to 30 wt. % of chromium.

9. The coated steel substrate as recited in claim 1 wherein the second coating has from 8 to 20 wt. % of aluminum.

10. The coated steel substrate as recited in claim 1 wherein the second coating has a thickness between 0.5 μm and 1000 μm.

11. The coated steel substrate as recited in claim 1 wherein the thickness of the first coating is less than the thickness of the second coating.

12. The coated steel substrate as recited in claim 1 wherein the second coating includes at least two layers each comprising from 2 to 30 wt. % of aluminum, from 10 to 40 wt % of chromium and optionally one or several elements chosen from the group consisting of yttrium, silicon, calcium, titanium, zirconium, vanadium, niobium and nickel in an amount below 10 wt. % for each element, a balance being iron.

13. The coated steel substrate as recited in claim 1 wherein the substrate is a semi-finished product such as a beam blank, slab, billet or bloom.

14. A method for the manufacture of a coated steel substrate as recited in claim 1 comprising the following steps:
providing the steel substrate;
depositing the first coating; and
depositing the second coating.

15. The method as recited in claim 14 wherein a preparation step on the steel surface is performed before the depositing of the first coating or the second coating.

16. The method as recited in claim 14 wherein the deposition of the first and second coating are independent from each other and performed by at least one of physical vapor deposition (PVD), cold spray, chemical vapor deposition (CVD), hot-dip coating, and electro-deposition.

17. The method as recited in claim 15 wherein in the preparation step is performed using physical bombardment of the steel surface including ions, electrons, metallic cluster, light, an energetic plasma, or using chemical treatment, or shot-blasting.

18. The method as recited in claim 14 wherein at least one of the first and second coating is deposited as a plurality of layers.

19. The method as recited in claim 15 wherein at least one of the first and second coating is deposited as a plurality of layers and the preparation step is performed before the deposition of each of the plurality of layers.

20. A method for manufacture of a steel product comprising the following successive steps:
providing the coated steel substrate as recited in claim 1; and
reheating the coated steel substrate in a reheating furnace having an atmosphere containing oxygen with a temperature between 850 and 1400° C.

21. The method as recited in claim 20 further comprising descaling of the reheated coated steel substrate.

22. The method as recited in claim 21 further comprising hot- forming of the descaled steel product.

23. The method as recited in claim 20 wherein the reheating is performed at a temperature between 1200 and 1400°° C.

24. The method as recited in claim 22 wherein the hot forming is hot-rolling, hot-extrusion, hot-stamping or hot bending.

* * * * *